United States Patent
Lim et al.

(10) Patent No.: US 9,418,932 B1
(45) Date of Patent: Aug. 16, 2016

(54) INTEGRATED CIRCUIT SYSTEM WITH TUNABLE RESISTOR AND METHOD OF MANUFACTURE THEREOF

(71) Applicant: Altera Corporation, San Jose, CA (US)

(72) Inventors: Queennie Suan Imm Lim, Santa Clara, CA (US); Jeffrey T. Watt, Palo Alto, CA (US); ShuXian Chen, Fremont, CA (US)

(73) Assignee: Altera Corporation, San Jose, CA (US)

( * ) Notice: Subject to any disclaimer, the term of this patent is extended or adjusted under 35 U.S.C. 154(b) by 0 days.

(21) Appl. No.: 14/663,114

(22) Filed: Mar. 19, 2015

(51) Int. Cl.
| | | |
|---|---|---|
| *H01L 27/01* | (2006.01) | |
| *H01L 23/522* | (2006.01) | |
| *H01L 27/06* | (2006.01) | |
| *H01L 49/02* | (2006.01) | |
| *H01C 10/08* | (2006.01) | |
| *H01C 10/23* | (2006.01) | |
| *H01C 1/14* | (2006.01) | |

(52) U.S. Cl.
CPC .............. *H01L 23/5228* (2013.01); *H01C 1/14* (2013.01); *H01C 10/08* (2013.01); *H01C 10/23* (2013.01); *H01L 27/0629* (2013.01); *H01L 28/20* (2013.01)

(58) Field of Classification Search
CPC .......... H01L 28/20; H01C 1/14; H01C 1/142; H01C 10/06; H01C 10/08; H01C 10/23
See application file for complete search history.

(56) References Cited

U.S. PATENT DOCUMENTS

| | | | | |
|---|---|---|---|---|
| 5,363,084 A | * | 11/1994 | Swinehart | H01C 10/08 338/195 |
| 7,205,880 B2 | * | 4/2007 | Fukunaga | H01L 27/0802 257/E27.047 |
| 7,583,527 B2 | | 9/2009 | Duch et al. | |
| 8,421,158 B2 | * | 4/2013 | Lin | H01L 21/768 257/379 |
| 8,555,216 B2 | | 10/2013 | Iben et al. | |
| 2007/0222552 A1 | * | 9/2007 | Lai | H01C 17/23 338/308 |
| 2012/0126370 A1 | * | 5/2012 | Harmon | H01L 23/3677 257/536 |
| 2014/0016281 A1 | | 1/2014 | Zickel et al. | |
| 2015/0028447 A1 | * | 1/2015 | Zhang | H01L 27/0617 257/529 |
| 2015/0260760 A1 | * | 9/2015 | Katakura | G01R 15/04 324/715 |

* cited by examiner

*Primary Examiner* — Bryan Junge

(57) ABSTRACT

An integrated circuit system, and a method of manufacture thereof, includes: an integrated circuit substrate; and a discretized tunable precision resistor having a total resistance including: a resistor body over the integrated circuit substrate, interconnects directly on the resistor body, metal taps directly on the interconnects and at opposing sides of the resistor body, and conductive metal strips over the interconnects, wherein the total resistance is a function of an active resistor length of the resistor body between a pair of the metal taps in contact with two of the conductive metal strips.

20 Claims, 3 Drawing Sheets

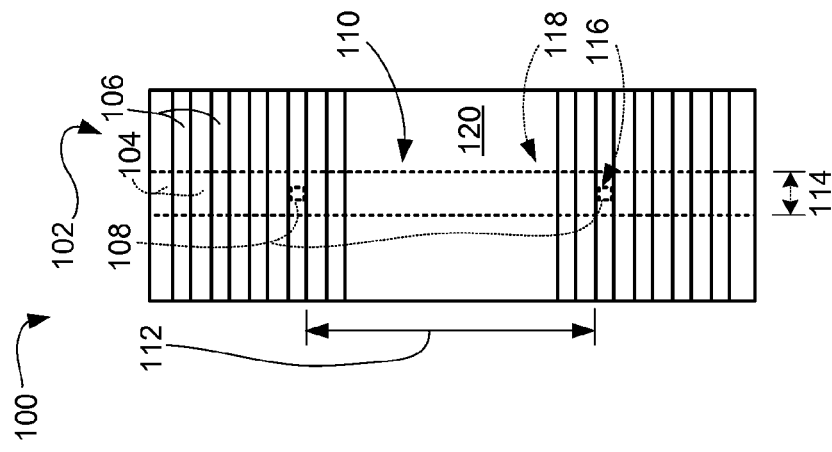
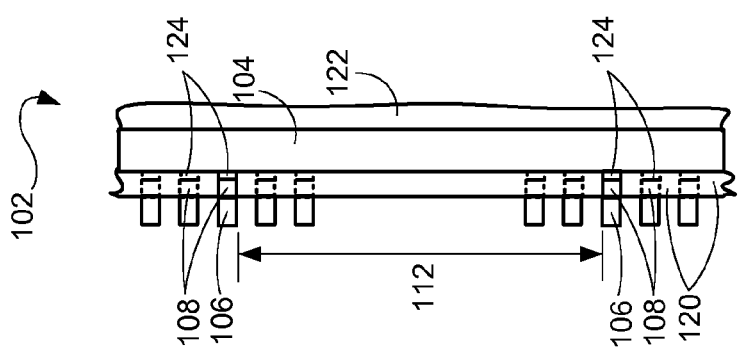
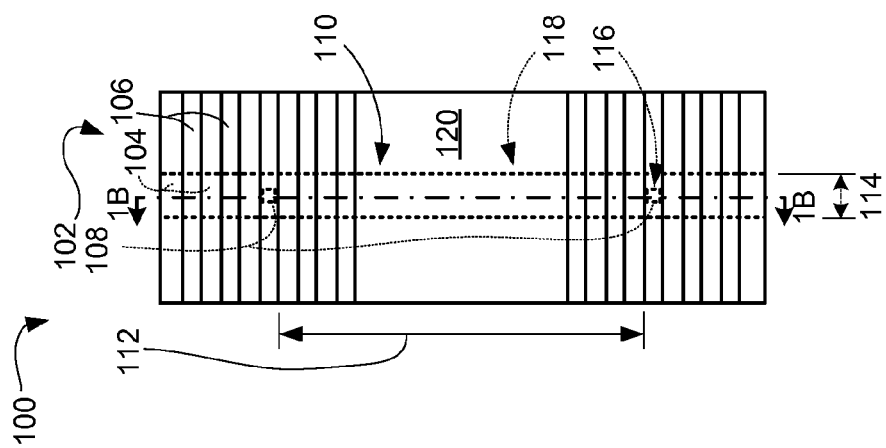

INTEGRATED CIRCUIT SYSTEM WITH TUNABLE RESISTOR AND METHOD OF MANUFACTURE THEREOF

TECHNICAL FIELD

The present invention relates generally to an integrated circuit system, and more particularly to a system for integrated circuits with resistors.

BACKGROUND ART

Accuracy of high precision resistors is important for many integrated circuit applications with, e.g., input/output (I/O) buffers. However, the accuracy of the actual integrated circuits to their mathematical models depends on foundry manufacturing processes used.

Often times, it is necessary to design high precision resistors before it is possible to validate the accuracy of the model versus a mature foundry manufacturing process. Further, it is a real challenge to change the process to meet the resistance accuracy requirements.

Any inaccuracy will require design changes and probably die size changes, which increase costs. In the end, it is often necessary to do layout redesigns and re-tapeout masks to meet the required resistance accuracy requirements. Die size change will impact overall integrated circuit ecosystem (abutment, density, routings, timing, etc.).

In the past, scalable resistors were often used to meet the required resistance accuracy requirements. Unfortunately, scalable resistors (P-cell) have certain limitations.

In new multi-gate or tri-gate semiconductor technologies, also known as FINFET technology, design rules restrict polysilicon gate lengths to 2 or 3 preset length dimensions so only width scaling is possible. This means a resistor footprint change is required if the resistance is off target. A footprint change means that the total die area will be impacted and changes to multiple masks would be required, e.g., metals, contacts, polysilicon, silicide block, and other masks.

Non-scalable or fixed-cell resistors also have been used. Non-scalable resistors are fine because they have a fixed footprint. Unfortunately, any discrepancy on the silicon die would require a whole template or fixed cell change. This again means a resistor footprint change is required if the resistance is off target. A footprint change again means that the total die area will be impacted and changes to multiple masks would be required, e.g., metals, contacts, polysilicon, silicide block, and other masks. The non-scalable or fixed-cell resistors can be connected in parallel or series to decrease or increase, respectively, resistance by a factor based on a number of the non-scalable or fixed-cell resistors.

Thus, a need still remains for a neutral area for any resistance changes, fewer mask changes to reduce cost, and the capability for finer resistance tuning. It is increasingly critical that answers be found to these problems. In view of the ever-increasing commercial competitive pressures, along with growing consumer expectations and the diminishing opportunities for meaningful product differentiation in the marketplace, it is critical that answers be found for these problems. Additionally, the need to reduce costs, improve efficiencies and performance, and meet competitive pressures adds an even greater urgency to the critical necessity for finding answers to these problems.

Solutions to these problems have been long sought but prior developments have not taught or suggested any solutions and, thus, solutions to these problems have long eluded those skilled in the art.

DISCLOSURE OF THE INVENTION

Embodiments of the present invention provide a method of manufacture of an integrated circuit system, including: providing an integrated circuit substrate; and forming a discretized tunable precision resistor having a total resistance including: forming a resistor body over the integrated circuit substrate, forming interconnects directly on the resistor body, forming metal taps directly on the interconnects and at opposing sides of the resistor body, and forming conductive metal strips over the interconnects, wherein the total resistance is a function of an active resistor length of the resistor body between a pair of the metal taps in contact with two of the conductive metal strips.

The embodiments of the present invention provide an integrated circuit system, including: an integrated circuit substrate; and a discretized tunable precision resistor having a total resistance including: a resistor body over the integrated circuit substrate, interconnects directly on the resistor body, metal taps directly on the interconnects and at opposing sides of the resistor body, and conductive metal strips over the interconnects, wherein the total resistance is a function of an active resistor length of the resistor body between a pair of the metal taps in contact with two of the conductive metal strips.

Certain embodiments of the invention have other steps or elements in addition to or in place of those mentioned above. The steps or the element will become apparent to those skilled in the art from a reading of the following detailed description when taken with reference to the accompanying drawings.

BRIEF DESCRIPTION OF THE DRAWINGS

FIG. 1A is a top view of a first embodiment of the present invention in a first configuration.

FIG. 1B is a cross-section of the first embodiment of the present invention in the first configuration along line 1B-1B of FIG. 1A.

FIG. 2 is a top view of the first embodiment of the present invention in a second configuration.

BEST MODE FOR CARRYING OUT THE INVENTION

Figures 3, 4, 5, 6:
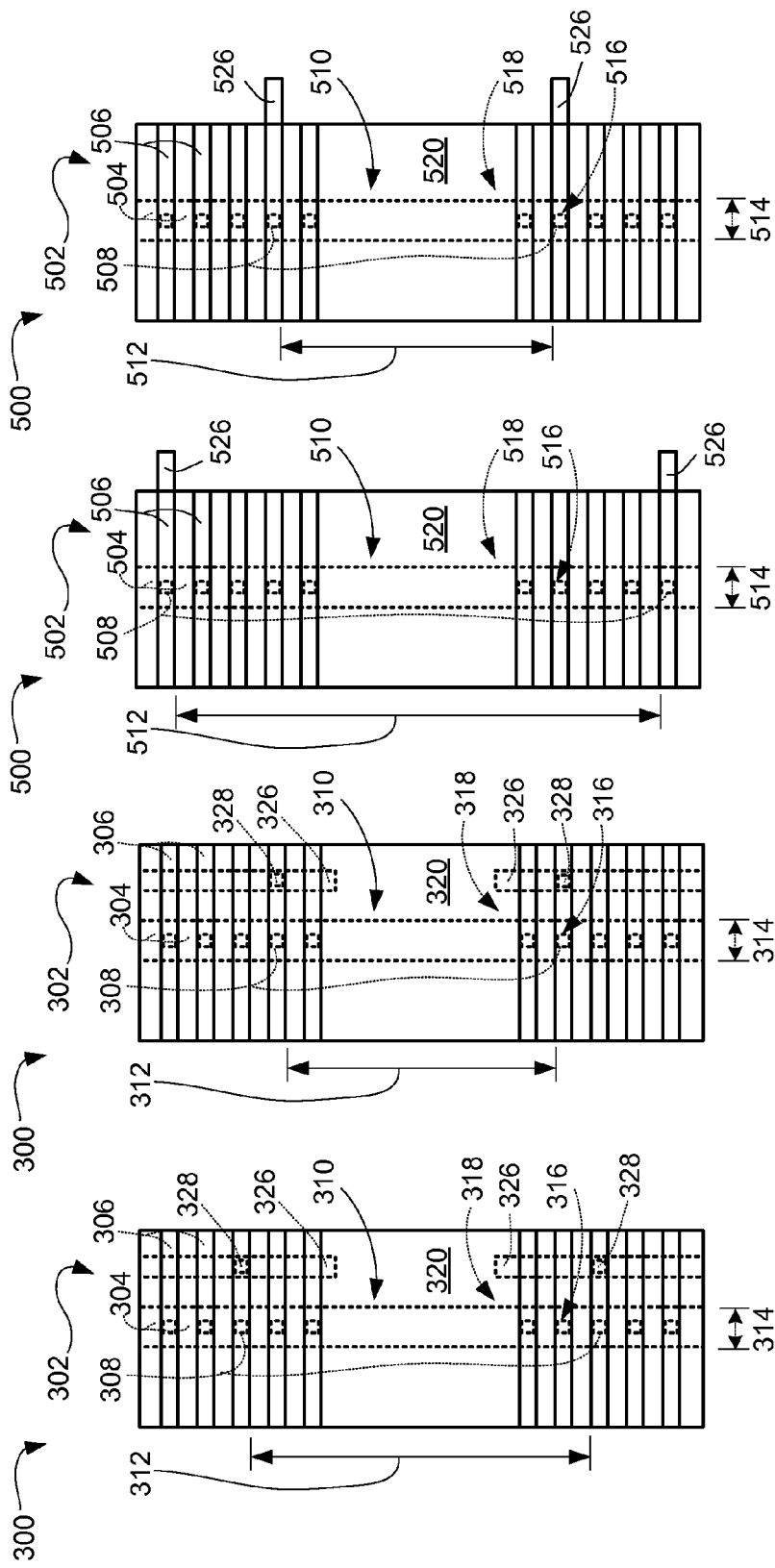
FIG. 3 is a top view of a second embodiment of the present invention in a first configuration.
FIG. 4 is a top view of the second embodiment of the present invention in a second configuration.
FIG. 5 is a top view of a third embodiment of the present invention in a first configuration.
FIG. 6 is a top view of the third embodiment of the present invention in a second configuration.

The following embodiments are described in sufficient detail to enable those skilled in the art to make and use the invention. It is to be understood that other embodiments would be evident based on the present disclosure, and that system, process, or mechanical changes may be made without departing from the scope of the embodiments of the present invention.

In the following description, numerous specific details are given to provide a thorough understanding of the invention. However, it will be apparent that the invention may be practiced without these specific details. In order to avoid obscuring the embodiments of the present invention, some well-known circuits, system configurations, and process steps are not disclosed in detail.

The drawings showing embodiments of the system are semi-diagrammatic and not to scale and, particularly, some of the dimensions are for the clarity of presentation and are shown exaggerated in the drawing FIGs. Similarly, although the views in the drawings for ease of description generally show similar orientations, this depiction in the FIGs. is arbitrary for the most part. Generally, the invention can be operated in any orientation.

Where multiple embodiments are disclosed and described having some features in common, for clarity and ease of illustration, description, and comprehension thereof, similar and like features one to another will ordinarily be described with similar reference numerals. The same numbers are used in all the drawing FIGs. to relate to the same elements.

The embodiments have been numbered first embodiment, second embodiment, etc. as a matter of descriptive convenience and are not intended to have any other significance or provide limitations for the embodiments of the present invention.

For expository purposes, the term "horizontal" as used herein is defined as a plane parallel to the plane or surface of the substrate, regardless of its orientation. The term "vertical" refers to a direction perpendicular to the horizontal as just defined. Terms, such as "above", "below", "bottom", "top", "side" (as in "sidewall"), "higher", "lower", "upper", "over", and "under", are defined with respect to the horizontal plane, as shown in the figures.

The term "on" means that there is contact between elements. The term "directly on" means that there is direct contact between one element and another element without an intervening element.

The term "processing" as used herein includes deposition of material or photoresist, patterning, exposure, development, etching, cleaning, and/or removal of the material or photoresist as required in forming a described structure.

Referring now to FIG. 1A, therein is shown a top view of a first embodiment of the present invention in a first configuration. The top view depicts an integrated circuit system 100 having a drawn resistor or a discretized tunable precision resistor 102.

The discretized tunable precision resistor 102 includes a high resistance resistor body 104. For example, the high resistance resistor body 104 is of a material such as polysilicon, titanium nitride (TiN), or a semiconductor metal gate material. Also for example, the high resistance resistor body 104 can be formed in a Silicide block region.

Conductive metal strips 106 are placed over the high resistance resistor body 104. A pair of metal taps 108 contacts two of the conductive metal strips 106. For example, the conductive metal strips 106 are of a metallic material, such as copper, aluminum, any other metallic material, or a metal alloy.

A total resistance 110 of the discretized tunable precision resistor 102 is a function of an active resistor length 112 of the high resistance resistor body 104 between the pair of the metal taps 108 according to the equation:

$$\text{Resistance} = (R_h * L/W) + 2 * R_{cont}$$

Where: $R_h$ = Resistor sheet resistance
L = Active resistor length
W = Active resistor width
$R_{cont}$ = Contact resistance The total resistance 110 is also a function of an active resistor width 114 of the high resistance resistor body 104, a contact resistance 116 of the metal taps 108, and a resistor sheet resistance 118 of the high resistance resistor body 104. A blockage layer or a block region is formed adjacent the high resistance resistor body 104 to provide the high resistance resistor body 104 with a high resistance. The blockage layer can represent a silicide block region.

The conductive metal strips 106 are over an insulation layer 120. The metal taps 108 are within the insulation layer 120. To make connections to the high resistance resistor body 104, connectors are formed. The connectors are formed by the conductive metal strips 106 and the metal taps 108. The connectors are formed at both sides of the discretized tunable precision resistor 102 on the high resistance resistor body 104.

The discretized tunable precision resistor 102 is a scalable resistor having a scalable region. The active resistor length 112 is not in fixed regions in a layout of the discretized tunable precision resistor 102, whereby the scalable region is between the fixed regions.

The discretized tunable precision resistor 102 is a scalable since the active resistor length 112 can be changed in the scalable region to provide any specific value of the total resistance 110. The total resistance 110 can be set to a specific value target based on results obtained using a calibration structure on a test chip or shuttle. A range of the total resistance 110 is variable. For example, the range can be approximately 200 to 2000 ohms/micrometer (um).

Changes of the total resistance 110 are discretized with step changes in layout. The calibration structure can be used to generate a graph of resistance values (in kOhms) versus active poly lengths or the active resistor length 112 (in um). For example, the graph can include a linear line, depending on the process. Also for example, the resistance values can be directly proportional to the active poly lengths.

As an example, the resistance values can include a range of approximately 0.8 to 1.6 kOhms, and the active poly lengths can include a range of approximately 0.35 to 0.73 um. As a specific example, the resistance values can include 1.6 kOhms and the active poly lengths can include 0.7 um.

The discretized tunable precision resistor 102 can be tunable up to approximately two times of a prefixed resistance value. Tunability depends on layout stepping and resistor length. Resolution depends on metal pitch and sheet resistance of resistors.

A calibration circuit of the calibration structure can be built on a side of the test chip or shuttle to generate calibration results for determining characteristics of a process. The calibration results can also provide the graph of the resistance values versus the active poly lengths.

It has been found that the discretized tunable precision resistor 102 is tunable by changing contact locations of the pair of the metal taps 108 along the length of the high resistance resistor body 104 because two terminals of the discretized tunable precision resistor 102 are the metal taps 108. The discretized tunable precision resistor 102 may be coupled to other circuitry. When the discretized tunable precision resistor 102 is coupled to the other circuitry, current flows through the high resistance resistor body 104 between two of the metal taps 108 that are connected to the high resistance resistor body 104.

For example, the discretized tunable precision resistor 102 may be coupled to the other circuitry by forming electrically conductive vias, contacts, or connectors in between and directly on other conductive metal strips of the other circuitry and any portions of respective ones of the conductive metal strips 106 connected to the metal taps 108. The other conductive metal strips can be over the conductive metal strips 106.

Also for example, the discretized tunable precision resistor 102 may be coupled to the other circuitry by connecting the other conductive metal strips to left ends or right ends of the respective ones of the conductive metal strips 106 connected to the metal taps 108. Further for example, the other conductive metal strips can be formed by the same metal layer that is used to form the conductive metal strips 106 connected to the metal taps 108.

It has also been found that the discretized tunable precision resistor 102 is formed by changing only a single contact mask for the metal taps 108.

It has further been found that the pair of the metal taps 108 increases parasitic capacitance, which does not impact designs that are insensitive to high parasitic capacitance.

It has further been found that fine changes in the discretized tunable precision resistor 102 is achievable by changing the resistor sheet resistance 118, the size of the high resistance resistor body 104, or a combination thereof.

It has further been found that the discretized tunable precision resistor 102 is tuned without any change in layout area of an integrated circuit. The area is maintained compared to an increase in area needed for a system that uses the scalable and non-scalable or fixed-cell resistors. Any change in an area of one resistor has a significant impact on the overall area of the integrated circuit because such resistor is replicated multiple times in the integrated circuit.

It has further been found that scaling or changing the active resistor length 112 is beneficial in cases where scaling or a number of values of the active resistor width 114 is limited or not an option.

Referring now to FIG. 1B, therein is shown a cross-section of the first embodiment of the present invention in the first configuration along line 1B-1B of FIG. 1A. FIG. 1B illustrates a structure of the first configuration with the discretized tunable precision resistor 102 on an integrated circuit substrate 122. The high resistance resistor body 104 extends over the integrated circuit substrate 122.

The insulation layer 120 is formed directly on the high resistance resistor body 104. Interconnects 124 are formed partially through and completely within the insulation layer 120 and directly on the high resistance resistor body 104. The metal taps 108 are formed partially through and completely within the insulation layer 120 and directly on the interconnects 124.

The interconnects 124 and the metal taps 108 are shown using solid lines. The interconnects 124 and the metal taps 108 can be formed at any other locations shown by dash lines to the left or the right of the interconnects 124 and the metal taps that are currently shown by the solid lines.

It is understood that only one of the interconnects 124 and only one of the metal taps 108 are formed at both opposing sides of the high resistance resistor body 104. The only one of the interconnects 124 and the only one of the metal taps 108 are formed directly under one of the conductive metal strips 106 on each opposing side of the high resistance resistor body 104. The remainder of the metal taps 108 and the interconnects 124 shown in FIG. 1B are not formed. Thus, only two of the conductive metal strips 106 are connected to the high resistance resistor body 104 through the metal taps 108 and the interconnects 124.

A number or all of the conductive metal strips 106 are formed over or directly on the insulation layer 120. Locations of the interconnects 124 and the metal taps 108 determine a numerical value of the active resistor length 112.

The interconnects 124 can represent high resistance precision resistor contacts or a local interconnects (LI). The interconnects 124 are formed using any number of methods. For example, one of the methods includes forming the interconnects 124 with a high resistance material with self-aligned silicide contact or LI. Also for example, another of the methods includes forming the interconnects 124 with a high resistance material with metal-interfacial layer-semiconductor (MIS) contact or LI.

The whole body of material of the high resistance resistor body 104 underneath contacted region can include high resistance materials. For example, the high resistance materials include polysilicon, TiN, metal gate, fin, or any semiconductor metal gate materials.

Referring now to FIG. 2, therein is shown a top view of the first embodiment of the present invention in a second configuration. The second configuration is similar to the first configuration, except for the locations of the metal taps 108 for changing the active resistor length 112.

If an actual silicon resistance value determined by the calibration results is higher than a prefixed value, a length of a resistor or the active resistor length 112 can be shorten or reduced. If an actual silicon resistance value is lower than the prefixed value, the length can be lengthen or increased. As an example, the active resistor length 112 of the second configuration is reduced and thus is less than the active resistor length 112 of the first configuration.

It has been found that it may take up more area because a shorter active length may be implemented if actual silicon is higher than the prefixed value in resistance.

Referring now to FIG. 3, therein is shown a top view of a second embodiment of the present invention in a first configuration. The top view depicts an integrated circuit system 300 having a discretized tunable precision resistor 302.

The discretized tunable precision resistor 302 includes metal taps 308, first conductive metal strips 306, and second conductive metal strips 326, and vias 328. The metal taps 308 are formed directly under a number or all of the first conductive metal strips 306. The metal taps 308 connect respective ones of the first conductive metal strips 306 with the resistor body of the discretized tunable precision resistor 302, as disclosed herein with respect to the metal taps 108 of FIG. 1B. The second conductive metal strips 326 are formed over the first conductive metal strips 306.

The second conductive metal strips 326 are formed approximately perpendicular to the first conductive metal strips 306. For example, the first conductive metal strips 306 can represent metal n. Also for example, the second conductive metal strips 326 can represent metal n+1.

For illustration purposes, the second conductive metal strips 326 are shown on the right of the high resistance resistor body 304, although it is understood that the second conductive metal strips 326 can be formed in any configuration. For example, both of the second conductive metal strips 326 can be formed over respective ones of the first conductive metal strips 306 on the left side or the right side of the high resistance resistor body 304. Also for example, one of the second conductive metal strips 326 can be formed over a respective one of the first conductive metal strips 306 on the left side of the high resistance resistor body 304 and another of the second conductive metal strips 326 can be formed over another respective one of the first conductive metal strips 306 on the right side of the high resistance resistor body 304.

Only one of the vias 328 is formed directly between and in direct contact with one of the first conductive metal strips 306 and one of the second conductive metal strips 326 on each opposing side of the discretized tunable precision resistor 302. Thus, two of the vias 328 are formed in the discretized tunable precision resistor 302. The vias 328 provide electrical connections between the first conductive metal strips 306 and the second conductive metal strips 326.

Only one of the vias 328 is formed at each of the opposing sides of a high resistance resistor body 304. Locations of the vias 328 determine a numerical value of an active resistor length 312.

Lower connections of the metal taps 308 are made using contacts or local interconnects. For example, the lower connections can be made using a high resistance material with self-aligned silicide contact or LI. Also for example, the lower connections can be made using a high resistance material with metal-interfacial layer-semiconductor MIS contact or LI.

A total resistance 310 is a function of resistances of the vias 328. The total resistance 310 is also a function of resistances of horizontal portions of the first conductive metal strips 306, where the horizontal portions are directly between the high resistance resistor body 304 and the second conductive metal strips 326.

The total resistance 310 is also a function of an active resistor width 314 of the high resistance resistor body 304, a contact resistance 316 of the metal taps 308, and a resistor sheet resistance 318 of the high resistance resistor body 304. An insulation layer 320 is formed similar to the insulation layer 120 of FIG. 1A.

It has been found that the discretized tunable precision resistor 302 is tunable by changing locations of the pair of the vias 328 along the length of the high resistance resistor body 304 because two terminals of the discretized tunable precision resistor 302 are the vias 328. The discretized tunable precision resistor 302 may be coupled to other circuitry. When the discretized tunable precision resistor 302 is coupled to the other circuitry, current flows through the high resistance resistor body 304, the second conductive metal strips 326, and the first conductive metal strips 306, between two of the vias 328.

For example, the discretized tunable precision resistor 302 may be coupled to the other circuitry by forming electrically conductive vias, contacts, or connectors in between and directly on other conductive metal strips of the other circuitry and any portions of the second conductive metal strips 326. The other conductive metal strips can be over the first conductive metal strips 306 or the second conductive metal strips 326.

Also for example, the discretized tunable precision resistor 302 may be coupled to the other circuitry by connecting one of the other conductive metal strips directly to a lower end of a lower one of the second conductive metal strips 326 and another of the other conductive metal strips directly to an upper end of an upper one of the second conductive metal strips 326. Further for example, the other conductive metal strips can be formed by the same metal layer that is used to form the second conductive metal strips 326.

It has also been found that the discretized tunable precision resistor 302 is formed by changing only a single mask for the vias 328.

It has further been found that the discretized tunable precision resistor 302 is tuned without any change in layout area of an integrated circuit. The area is maintained compared to an increase in area needed for a system that uses the scalable and non-scalable or fixed-cell resistors. Any change in an area of one resistor has a significant impact on the overall area of the integrated circuit because such resistor is replicated multiple times in the integrated circuit.

Referring now to FIG. 4, therein is shown a top view of the second embodiment of the present invention in a second configuration. The second configuration is similar to the first configuration, except for the locations of the vias 328 for changing the active resistor length 312.

If an actual silicon resistance value determined by the calibration results is higher than a prefixed value, a length of the active resistor length 312 can be shorten or reduced. If an actual silicon resistance value is lower than the prefixed value, the length can be lengthen or increased. As an example, the active resistor length 312 of the second configuration is reduced and thus is less than the active resistor length 312 of the first configuration.

Referring now to FIG. 5, therein is shown a top view of a third embodiment of the present invention in a first configuration. The top view depicts an integrated circuit system 500 having a discretized tunable precision resistor 502. The discretized tunable precision resistor 502 includes first conductive metal strips 506 and second conductive metal strips 526. Metal taps 508 connect respective ones of the first conductive metal strips 506 with the resistor body of the discretized tunable precision resistor 502, as disclosed herein with respect to the metal taps 108 of FIG. 1B.

The second conductive metal strips 526 are formed adjacent or in direct contact with the first conductive metal strips 506. The second conductive metal strips 526 are coplanar with the first conductive metal strips 506.

For illustration purposes, the second conductive metal strips 526 are shown on the right of the first conductive metal strips 506, although it is understood that the second conductive metal strips 526 can be formed in any configuration. For example, both of the second conductive metal strips 526 can be directly connected to left ends or right ends of the first conductive metal strips 506. Also for example, one of the second conductive metal strips 526 can be directly connected to a left end of a respective one of the first conductive metal strips 506 and another of the second conductive metal strips 526 can be directly connected to a right end of another respective one of the first conductive metal strips 506.

Only one of the second conductive metal strips 526 is formed at each of the opposing sides of a high resistance resistor body 504 as shown in FIG. 5. Locations of the second conductive metal strips 526 determine a numerical value of an active resistor length 512.

A total resistance 510 is a function of resistances of the second conductive metal strips 526. The total resistance 510 is also a function of an active resistor width 514 of the high resistance resistor body 504, a contact resistance 516 of the metal taps 508, and a resistor sheet resistance 518 of the high resistance resistor body 504. An insulation layer 520 is formed similar to the insulation layer 120 of FIG. 1A.

It has been found that the discretized tunable precision resistor 502 is tunable by changing locations of the metal taps 508 and the second conductive metal strips 526 along the length of the high resistance resistor body 504 because two terminals of the discretized tunable precision resistor 502 are the metal taps 508. The discretized tunable precision resistor 502 may be coupled to other circuitry. When the discretized tunable precision resistor 502 is coupled to the other circuitry, current flows through the first conductive metal strips 506 and the high resistance resistor body 504, between two of the second conductive metal strips 526.

For example, the discretized tunable precision resistor 502 may be coupled to the other circuitry by forming electrically conductive vias, contacts, or connectors in between and directly on other conductive metal strips of the other circuitry and any portions of the second conductive metal strips 526 or of respective ones of the first conductive metal strips 506 connected to the metal taps 508. The other conductive metal strips can be over the first conductive metal strips 506 or the second conductive metal strips 526.

Also for example, the discretized tunable precision resistor 502 may be coupled to the other circuitry by connecting the other conductive metal strips directly to ends of the second conductive metal strips 526. Further for example, the other conductive metal strips can be formed by the same metal layer that is used to form the second conductive metal strips 526.

It has also been found that the discretized tunable precision resistor 502 is formed by changing only a single mask for the second conductive metal strips 526.

It has further been found that the discretized tunable precision resistor 502 is tuned without any change in layout area of an integrated circuit. The area is maintained compared to an increase in area needed for a system that uses the scalable and non-scalable or fixed-cell resistors. Any change in an area of one resistor has a significant impact on the overall area of the integrated circuit because such resistor is replicated multiple times in the integrated circuit.

Referring now to FIG. 6, therein is shown a top view of the third embodiment of the present invention in a second configuration. The second configuration is similar to the first configuration, except for the locations of the second conductive metal strips 526 for changing the active resistor length 512.

If an actual silicon resistance value determined by the calibration results is higher than a prefixed value, a length of the active resistor length 512 can be shorten or reduced. If an actual silicon resistance value is lower than the prefixed value, the length can be lengthen or increased. As an example, the active resistor length 512 of the second configuration is reduced and thus is less than the active resistor length 512 of the first configuration.

Figure 7:
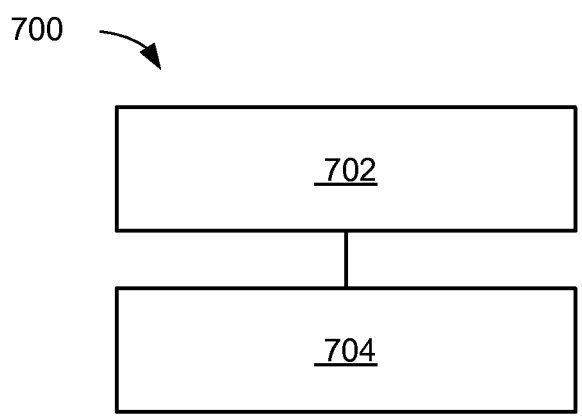
FIG. 7 is a flow chart of a method of manufacture of an integrated circuit system in a further embodiment of the present invention.

Referring now to FIG. 7, therein is shown a flow chart of a method 700 of manufacture of an integrated circuit system in a further embodiment of the present invention. The method 700 includes: providing an integrated circuit substrate in a block 702; and forming a discretized tunable precision resistor having a total resistance including: forming a resistor body over the integrated circuit substrate, forming interconnects directly on the resistor body, forming metal taps directly on the interconnects and at opposing sides of the resistor body, and forming conductive metal strips over the interconnects, wherein the total resistance is a function of an active resistor length of the resistor body between a pair of the metal taps in contact with two of the conductive metal strips in a block 704.

Thus, it has been discovered that the integrated circuit systems of the embodiments of the present invention furnish important and heretofore unknown and unavailable solutions, capabilities, and functional aspects for resistor tuning.

The resulting method, process, apparatus, device, product, and/or system is straightforward, cost-effective, uncomplicated, highly versatile, accurate, sensitive, and effective, and can be implemented by adapting known components for ready, efficient, and economical manufacturing, application, and utilization.

Another important aspect of the embodiments of the present invention is that they valuably supports and services the historical trend of reducing costs, simplifying systems, and increasing performance.

These and other valuable aspects of the embodiments of the present invention consequently further the state of the technology to at least the next level.

While the invention has been described in conjunction with a specific best mode, it is to be understood that many alternatives, modifications, and variations will be apparent to those skilled in the art in light of the aforegoing description. Accordingly, it is intended to embrace all such alternatives, modifications, and variations that fall within the scope of the included claims. All matters hithertofore set forth herein or shown in the accompanying drawings are to be interpreted in an illustrative and non-limiting sense.

What is claimed is:

1. A method of manufacture of an integrated circuit system comprising:
    providing an integrated circuit substrate; and
    forming a discretized tunable precision resistor having a total resistance including:
        forming a resistor body over the integrated circuit substrate,
        forming interconnects directly on the resistor body,
        forming metal taps directly on the interconnects and at opposing sides of the resistor body, wherein only one of the metal taps is at each of the opposing sides of the resistor body, and
        forming conductive metal strips over the interconnects, wherein multiple of the conductive metal strips are at each of the opposing sides of the resistor body, the only one of the metal taps is directly under one of the multiple of the conductive metal strips, and the total resistance is a function of an active resistor length of the resistor body between a pair of the metal taps in contact with two of the conductive metal strips.

2. The method as claimed in claim 1 wherein forming the discretized tunable precision resistor includes:
    forming an insulation layer directly on the resistor body, and
    forming the metal taps within the insulation layer.

3. The method as claimed in claim 1 wherein forming the discretized tunable precision resistor includes forming the discretized tunable precision resistor having first conductive metal strips, second conductive metal strips perpendicular to the first conductive metal strips, and vias in direct contact with the first conductive metal strips and the second conductive metal strips.

4. The method as claimed in claim 1 wherein forming the discretized tunable precision resistor includes forming the discretized tunable precision resistor having first conductive metal strips and second conductive metal strips in direct contact with the first conductive metal strips.

5. The method as claimed in claim 1 wherein forming the discretized tunable precision resistor includes forming the discretized tunable precision resistor having the total resistance as a function of an active resistor width of the resistor body.

6. A method of manufacture of an integrated circuit system comprising:
    providing an integrated circuit substrate; and
    forming a discretized tunable precision resistor having a total resistance including:
        forming a resistor body over the integrated circuit substrate,
        forming an insulation layer directly on the resistor body,
        forming interconnects partially through the insulation layer and directly on the resistor body,
        forming metal taps directly on the interconnects and at opposing sides of the resistor body, wherein only one of the metal taps is at each of the opposing sides of the resistor body, and
        forming conductive metal strips over the interconnects, wherein multiple of the conductive metal strips are at each of the opposing sides of the resistor body, the only one of the metal taps is directly under one of the multiple of the conductive metal strips, and the total resistance is a function of an active resistor length of the resistor body between a pair of the metal taps in contact with two of the conductive metal strips.

7. The method as claimed in claim 6 wherein forming the discretized tunable precision resistor includes:
   forming the interconnects within the insulation layer, wherein only one of the interconnects is at each of the opposing sides of the resistor body, and
   forming the metal taps within the insulation layer.

8. The method as claimed in claim 6 wherein forming the discretized tunable precision resistor includes forming the discretized tunable precision resistor having first conductive metal strips, second conductive metal strips perpendicular to the first conductive metal strips, and vias directly between and in direct contact with the first conductive metal strips and the second conductive metal strips.

9. The method as claimed in claim 6 wherein forming the discretized tunable precision resistor includes forming the discretized tunable precision resistor having first conductive metal strips and second conductive metal strips coplanar and in direct contact with the first conductive metal strips.

10. The method as claimed in claim 6 wherein forming the discretized tunable precision resistor includes forming the discretized tunable precision resistor having the total resistance as a function of an active resistor width of the resistor body and a contact resistance of the metal taps.

11. An integrated circuit system comprising:
   an integrated circuit substrate; and
   a discretized tunable precision resistor having a total resistance including:
      a resistor body over the integrated circuit substrate,
      interconnects directly on the resistor body,
      metal taps directly on the interconnects and at opposing sides of the resistor body, wherein only one of the metal taps is at each of the opposing sides of the resistor body, and
      conductive metal strips over the interconnects, wherein multiple of the conductive metal strips are at each of the opposing sides of the resistor body, the only one of the metal taps is directly under one of the multiple of the conductive metal strips, and the total resistance is a function of an active resistor length of the resistor body between a pair of the metal taps in contact with two of the conductive metal strips.

12. The system as claimed in claim 11 wherein the discretized tunable precision resistor includes:
   an insulation layer directly on the resistor body, and
   the metal taps within the insulation layer.

13. The system as claimed in claim 11 wherein the discretized tunable precision resistor includes first conductive metal strips, second conductive metal strips perpendicular to the first conductive metal strips, and vias in direct contact with the first conductive metal strips and the second conductive metal strips.

14. The system as claimed in claim 11 wherein the discretized tunable precision resistor includes first conductive metal strips and second conductive metal strips in direct contact with the first conductive metal strips.

15. The system as claimed in claim 11 wherein the discretized tunable precision resistor includes the total resistance as a function of an active resistor width of the resistor body.

16. The system as claimed in claim 11 wherein the discretized tunable precision resistor includes an insulation layer directly on the resistor body and the interconnects partially through the insulation layer.

17. The system as claimed in claim 16 wherein the discretized tunable precision resistor includes:
   the interconnects within the insulation layer, wherein only one of the interconnects is at each of the opposing sides of the resistor body, and
   the metal taps within the insulation layer.

18. The system as claimed in claim 16 wherein the discretized tunable precision resistor includes first conductive metal strips, second conductive metal strips perpendicular to the first conductive metal strips, and vias directly between and in direct contact with the first conductive metal strips and the second conductive metal strips.

19. The system as claimed in claim 16 wherein the discretized tunable precision resistor includes first conductive metal strips and second conductive metal strips coplanar and in direct contact with the first conductive metal strips.

20. The system as claimed in claim 16 wherein forming the discretized tunable precision resistor includes the total resistance as a function of an active resistor width of the resistor body and a contact resistance of the metal taps.

* * * * *